United States Patent [19]

Niino et al.

[11] Patent Number: 5,316,472
[45] Date of Patent: May 31, 1994

[54] VERTICAL BOAT USED FOR HEAT TREATMENT OF SEMICONDUCTOR WAFER AND VERTICAL HEAT TREATMENT APPARATUS

[75] Inventors: Reiji Niino, Kofu; Isao Siratani; Yutaka Simada, both of Sagamihara; Hiroki Fukusima, Sagamihara; Hirofumi Kitayama, Kanagawa; Akimichi Yonekura; Yuuichi Mikata, both of Kawasaki, all of Japan

[73] Assignees: Tokyo Electron Limited, Tokyo; Tokyo Electron Sagami Limited, Kanagawa; Kabushiki Kaisha Toshiba, Kawasaki, all of Japan

[21] Appl. No.: 991,597

[22] Filed: Dec. 16, 1992

[30] Foreign Application Priority Data

Dec. 16, 1991 [JP] Japan ................. 3-331076

[51] Int. Cl.⁵ .............................. F27D 3/12
[52] U.S. Cl. ..................... 432/241; 432/258; 432/239
[58] Field of Search ............ 432/253, 241, 5, 6, 432/11, 152, 258, 259

[56] References Cited

U.S. PATENT DOCUMENTS

| | | | |
|---|---|---|---|
| 2,208,734 | 7/1940 | Schreiber | 432/259 |
| 3,948,594 | 4/1976 | Irwin, Jr. | 432/259 |
| 4,468,259 | 8/1984 | Mimura | |
| 4,504,224 | 3/1985 | Hewitt | 432/258 |
| 4,636,170 | 1/1987 | Stupka | 432/258 |
| 4,938,691 | 7/1990 | Ohkase et al. | 432/253 |
| 5,131,842 | 7/1992 | Miyazchi et al. | 432/253 |

FOREIGN PATENT DOCUMENTS

61-247048  11/1986  Japan.
383730  4/1991  Japan.

*Primary Examiner*—Henry C. Yuen
*Attorney, Agent, or Firm*—Oblon, Spivak, McClelland, Maier & Neustadt

[57] ABSTRACT

A semiconductor wafer boat used in a vertical CVD apparatus includes four columns fixed to upper and lower support plates. Each of the columns has a plurality of first grooves arranged at regular intervals in the vertical direction so as to place wafers in substantially parallel to each other, and a plurality of second grooves formed alternately with the first grooves. A plate ring is provided for each of the second grooves so as to improve the uniformity of thickness of a film to be formed on each wafer. Each ring has an outer diameter larger than that of a wafer, and an inner diameter smaller than that of the wafer. Each ring is placed such that there is a clearance for transferring each wafer between each ring and each wafer in the vertical direction.

24 Claims, 7 Drawing Sheets

VERTICAL BOAT USED FOR HEAT TREATMENT OF SEMICONDUCTOR WAFER AND VERTICAL HEAT TREATMENT APPARATUS

BACKGROUND OF THE INVENTION

1. Field of the Invention

The present invention relates to a vertical boat used for heat treatment of a semiconductor wafer, and a vertical heat treatment apparatus using the same.

2. Description of the Related Art

In an vertical CVD apparatus for processing a number of semiconductor wafers in a batch manner, wafers are placed in a wafer boat, which is further loaded on the process chamber. The boat is made of a heat-proof quartz or the like, and has a structure having wafer placement positions arranged in the vertical direction such as to have an interval between adjacent wafers when placed.

Published Unexamined Japanese Patent Application (PUJPA) No. 61-247048, and PUJPA No. 3-83730 disclose a structure in which rings each encircling a wafer are placed at the placement positions. With the structure set forth in each of these reference, a wafer is directly set on a ring. A ring serves to improve the uniformity of thickness within the surface of the thin film formed on a wafer.

U.S. patent application 07/765,888 (filed Sep. 26, 1991) discloses a structure in which a number of quartz support stands are provided on each of the rings, and a wafer is set on the stands. With this structure, there is created a gap between the ring and the wafer, and therefore it becomes easy to transfer wafers onto or from a boat, and to supply process gas thereonto.

With the structure set forth in each of the PUJPA Nos. 61-247048 and 3-83730, there must be provided a mechanism for lifting a wafer above from the ring when the wafer is transferred onto or from the boat. Since this lifting mechanism is used in combination with the transfer mechanism, an interval between adjacent wafer placement positions must be taken wide. With the structure disclosed in U.S. application No. 07/765,888, formation process of the support stands is complicated, and therefore it is difficult to achieve a high dimensional precision for each stand. As a result, it is necessary to provide a wide interval between adjacent wafer placement positions so as to compensate for the dimensional precision.

For the reason stated above, the interval between adjacent wafer placement positions is generally set at 9/16 inches in the above-described structures. The interval between adjacent placement positions depends on the number of wafers mounted on a boat having a predetermined length, and must be set as narrow as possible.

Further, with the structures described above, the thickness of the rings cannot be reduced because the rings must have a certain mechanical strength to support a wafer. In particular, with the latter structure, the rings must have a such strength that they can remain during process of the support stands. More specifically, for a semiconductor wafer generally having a thickness of 0.6 mm to 0.7 mm, the thickness of each ring should be 3 mm, about 4.5 to 5 times as thick as the wafer. However, a thick ring is not desirable, because it not only entails a high production cost, but also provides a thermal capacity more than necessary, to the periphery of a wafer.

SUMMARY OF THE INVENTION

An object of the invention is to improve a boat of the above-mentioned type so as to achieve a narrower interval between adjacent wafer placement positions than that of the conventional type.

Another object of the invention is to improve a boat of the above-mentioned type so as to reduce the thickness of rings.

According to the present invention, there is provided a vertical boat used for heat-treating a plurality of semiconductor wafers each having a main region to be processed on the upper surface, at the same time, comprising:

an upper support plate;
a lower support plate;
a plurality of columns, an upper end of each of which is fixed to the upper support plate, and an lower end of each of which is fixed to the lower support plate, each of the columns having a plurality of first steps formed in the vertical direction with intervals therebetween so as to support the wafers substantially parallel to each other, and a plurality of second steps formed such as to be arranged alternately with the first steps; and a plurality of plate rings, each having an outer diameter larger than that of the wafers, and an inner diameter defining an opening for exposing substantially the entire main region of each wafer, and provided on the second steps, the rings arranged so as to provide clearances for transferring each wafer between each ring and adjacent wafers in the vertical direction, and serving to improve a uniformity of a heat treatment carried out on the wafers.

The first and second steps can be provided in the form of first and second grooves, and preferably the first grooves are arranged at regular intervals, and so are the second grooves. Further, the thickness of the ring is less than 3 times as much as that of the wafer.

With the boat having an structure according to the present invention, a gas flow in the heat treatment apparatus can be controlled by means of the ring having a diameter larger than that of the wafer, and therefore the uniformity of a heat treatment on the wafers can be improved as compared to the conventional techniques. At the same time, since the grooves formed stepwise on a column serve to support rings and wafers, the shape of each of the structural members made of, for example, quartz, does not become complex, and can be made easily. Moreover, in the invention, for example, wafers are not placed on the rings, but supported by the grooves formed on the columns. Consequently, a transfer arm used for transferring wafers can be inserted underneath a wafer, and thus a requirement for the automatic transfer of wafers can be fully met.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
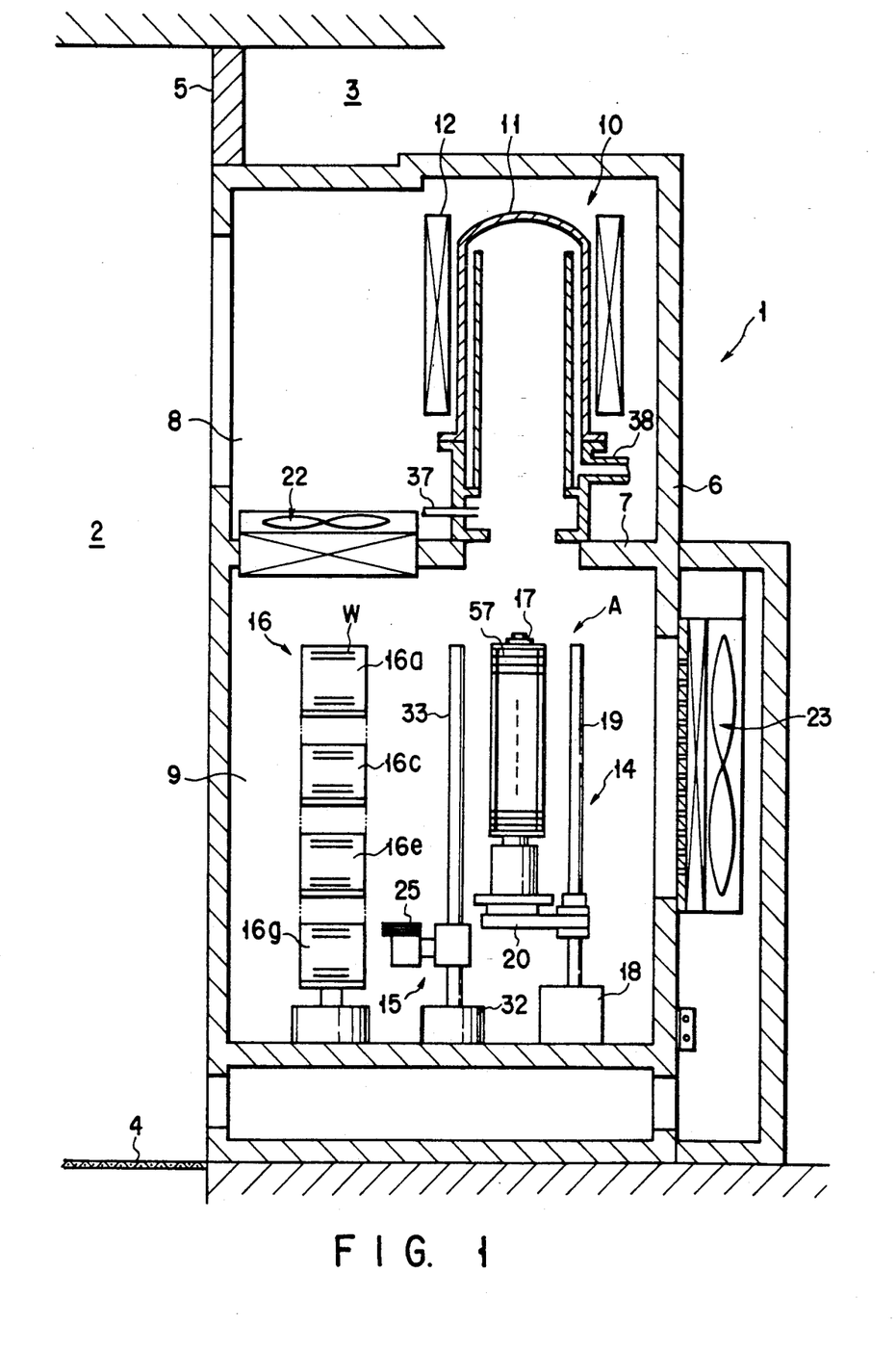
FIG. 1 is a cross sectional view showing a vertical CVD apparatus in which a wafer board according to the invention is used.

FIG. 1 shows a vertical CVD apparatus in which a wafer boat according to the invention is used.

The apparatus 1 is placed in a utility zone 3 located adjacent to a clean room 2 used for manufacturing a semiconductor. In general, the floor of the clean room 2 is formed of a net 4 through which dusts and the like can pass, and the ventilation between the clean room 2 and the utility zone 3 is shut off by means of a partition wall 5. The apparatus 1 is set such that the front surface of the apparatus projects toward the clean room side through the opening formed in the partition wall 5.

As can be seen in FIG. 1, the apparatus 1 includes a housing 6, the inside of which is divided into a loading room 8 and an unloading room 9 by means of a partition plate 7. In the loading room 8, there is provided a heat treatment furnace 10 consisting of a process chamber 11 and a heater 12. The heater 12 is divided into 3 zones along the longitudinal direction of the process chamber 11, and the temperature of each zone can be independently controlled. The heater 12 is made of coils wound around the process chamber 11 without touching the chamber, and with a predetermined gap between coils. The process chamber 11 is heated by the heater 12 up to a predetermined temperature necessary for a film formation process by the CVD in the process chamber 11, for example, about 500°-1000° C.

Figure 3:
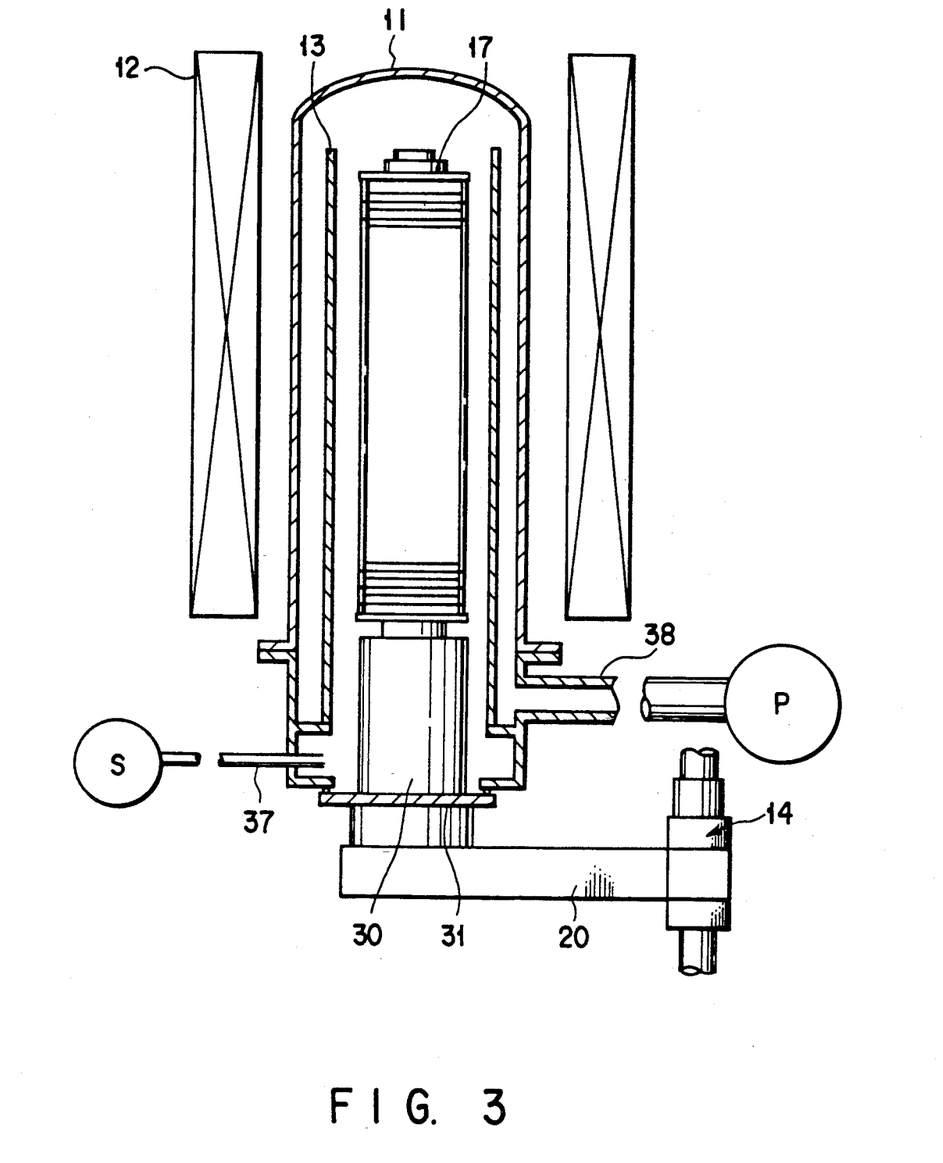
FIG. 3 is a cross sectional view showing the apparatus when the wafer boat is loaded in a process chamber.

As shown in FIG. 3 with an enlarged view, the process chamber 11 has a double-tube structure including an inner tube 13. The process chamber 11 is made of a material having a low reactivity with the process gas and a heat-proof property, for example, quartz. The process chamber 11 is connected to a gas supply source S via a gas supply tube 37. The chamber 11 is also connected to an exhaustion tube 38, which is further connected to a vacuum pump P for exhausting some of the process gas, and serving to reduce the pressure in the process chamber 11 to a desired one.

In the unloading room 9, clean air is supplied via units 22 and 23 each having a fan and a filter. The unloading room 9 includes a boat elevator 14, a conveying robot 15, and a cassette section 16.

The elevator 14 conveys a wafer boat 17 between an unloading position A shown in FIG. 1, and a loading position shown in FIG. 3. The wafer boat 17 will be described in detail later.

The elevator 14 includes a lift/lower mechanism 18 for lifting/lowering a boat 17. The lift/lower mechanism has a guide rod 19 extending in the vertical direction, and the first arm 20 slidably mounted on this guide rod 19. The first arm 20 moves along the guide rod 19 by means of a motor (not shown). The second arm 21 is pivotably mounted on the tip portion of the first arm 20. Further, the elevator 14 includes a motor (not shown) for rotating the first arm 20 in the direction indicated by the arrow 8 shown in FIG. 2, and another motor (not shown) for rotating the boat 17 in the directions indicated by the arrow 8.

Figure 2:
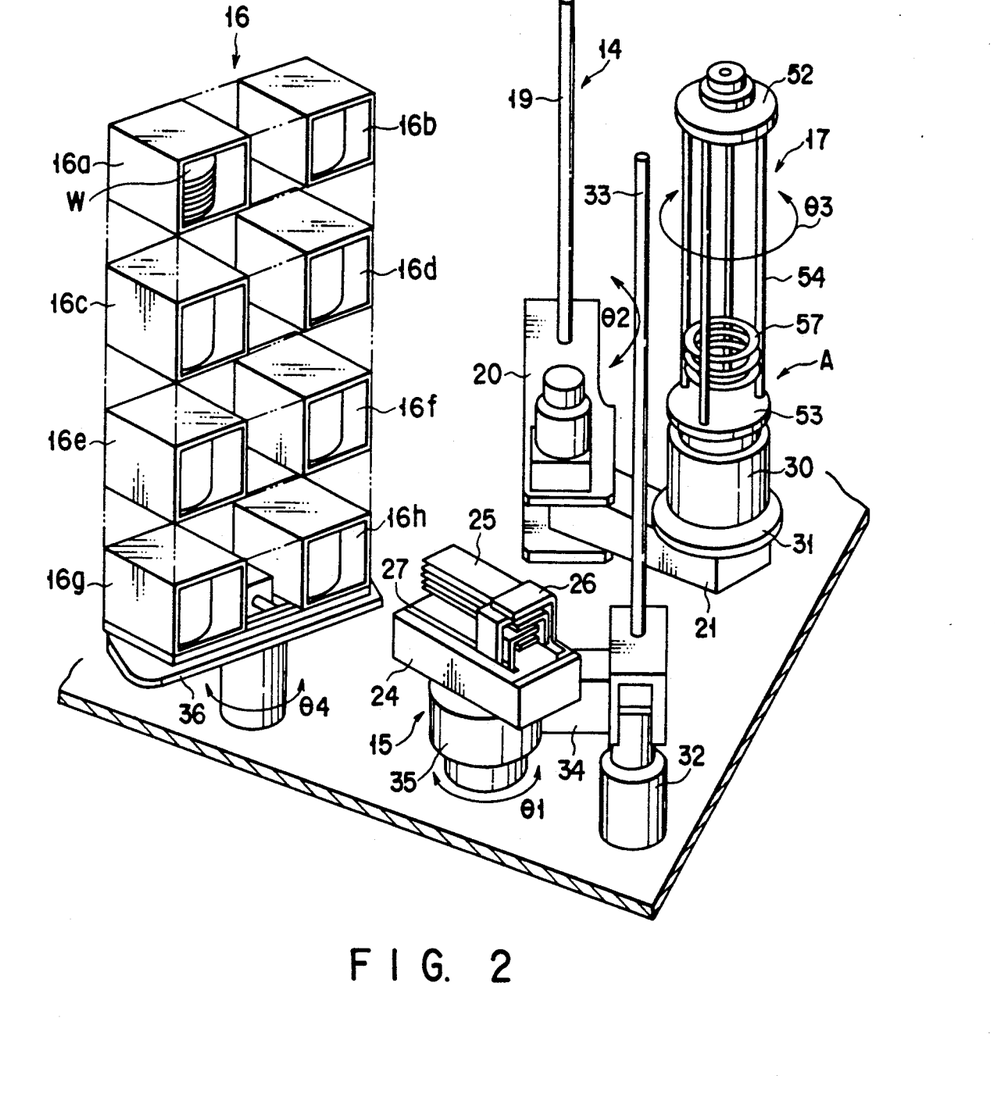
FIG. 2 is a detailed perspective view showing an unloading room of the apparatus.

As can be seen in FIG. 2, there is provided underneath the wafer boat 17 a heat preservation cylinder 30 for retaining the temperature of a wafer W. Further, there is provided under the cylinder 30 a flange 31, which is to abut to the lower opening of the process chamber 11 when the boat 17 is set to the loading position so as to maintain the air tightness in the process chamber 11. The flange 31 is located on the tip of the second arm 21.

The conveying robot 15 includes a drive block 24 as shown in FIG. 2, and the drive block 24 further includes five wafer-supporting arms 25. The proximal end of each arm 25 is fixed to a slider provided on the drive block 24. The slider 26 is provided movably back and forth on a slide groove 27 formed in the drive block 24. The drive block 24 contains a drive mechanism for moving the slider 26 back and forth, so that the arms 25 can be moved independently or all at the same time.

The drive block 24 includes a mechanism for changing intervals between arms 25. In the case where the wafer arrangement intervals of wafer cassettes 16a–6h differ from those of the boat 17, wafer intervals can be adjusted such that the wafer cassettes and the boat meet with each other when the wafers are transferred therebetween. The mechanism for changing the intervals of the arms 25 is described in detail in co-pending U.S. patent application No. 07/788,506 filed by Asano et al., Nov. 30, 1991, the teachings of which are hereby incorporated by reference.

The convey robot 15 includes a lift/lower mechanism 32 for lifting/lowering the drive block 24. The lift/lower mechanism 32 comprises a guide rod 33 extending in the vertical direction, and a motor (not shown) for lifting/lowering an arm 34 mounted slidably on the guide rod 33. On the tip portion of the arm 34, there is provided a rotation driving mechanism 35 for supporting and rotating the slide block 24 in the directions indicated by arrow $\theta 1$ over 200°.

The cassette section 16 includes a placement base 36, on which eight wafer cassettes 16a–16h are placed, and each of which can hold a plurality of, for example, 25 wafers. The wafer placement base 36 is rotated in the directions indicated by arrow $\theta 4$ shown in FIG. 2 by means of a motor (not shown). With the above-mentioned structure, as the wafer cassette section 16 is directed to the convey robot 15, and the support arms 15 of the convey robot 15 are driven back and forth, the wafers W are removed from each cassette and transferred to the boat 17.

Figure 4:
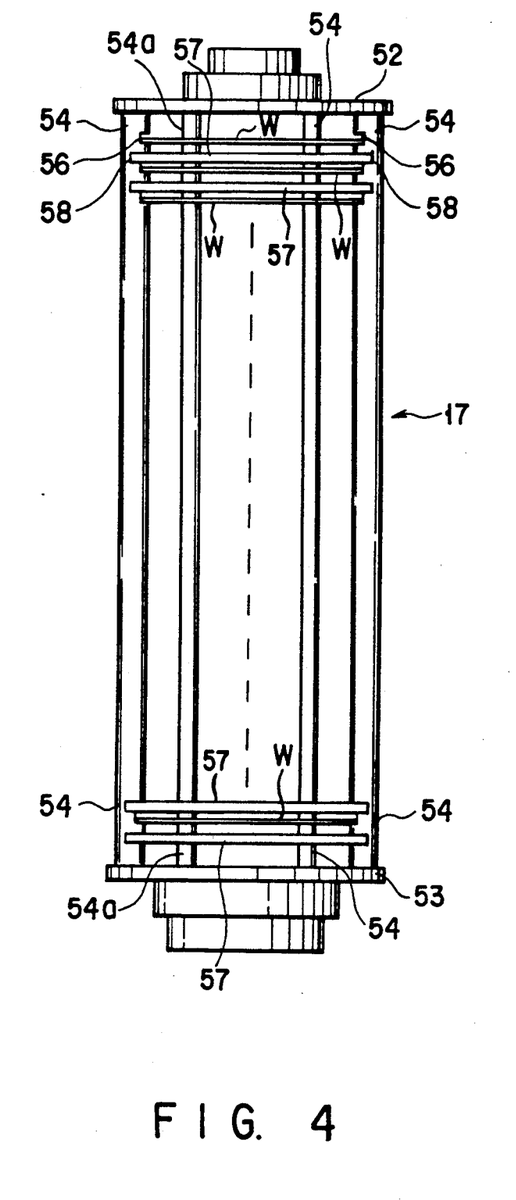
FIG. 4 is an enlarged elevational view showing the wafer boat.
Figure 5:
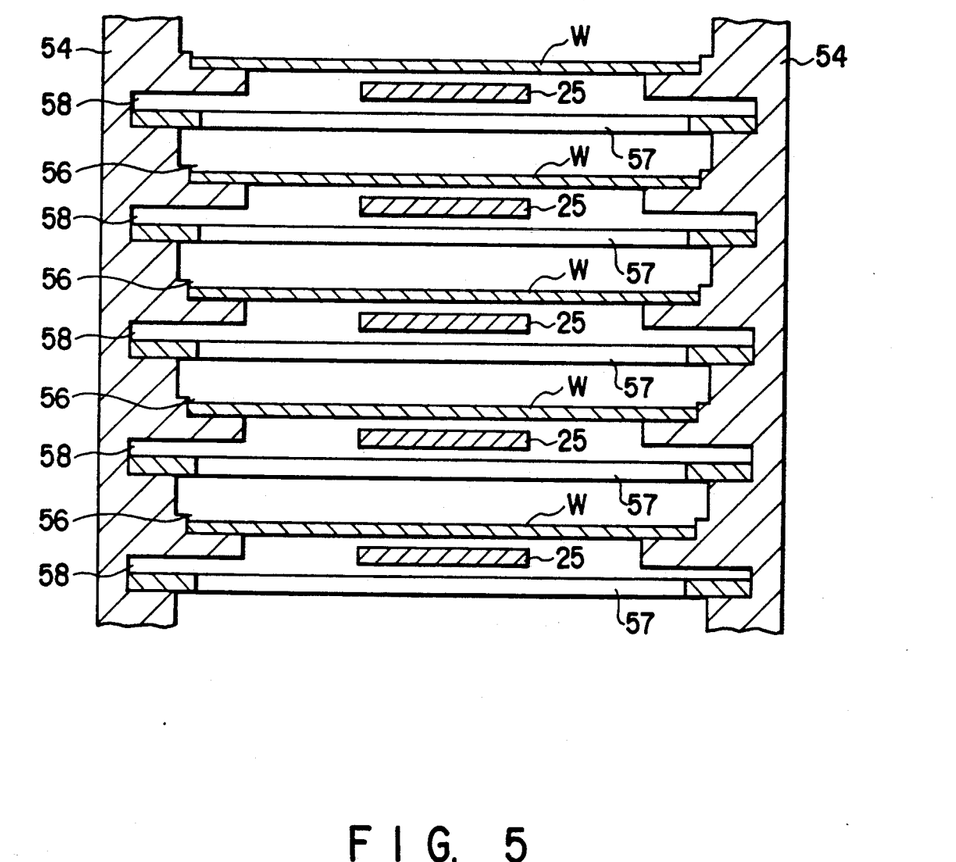
FIG. 5 is an enlarged cross sectional view showing a portion of the wafer boat.

FIG. 4 is an enlarged elevational view of the wafer boat 17 according to the invention, and FIG. 5 is an enlarged cross sectional view showing a portion of the wafer boat.

On the boat 17, an upper support plate 52 and a lower support plate 53, both made of a heat-proof material such as quartz into a disk-like shape, are provided. Between the upper support plate 52 and the lower support plate 53, four columns 54 each made of quartz or the like are fixed.

As can be seen in FIG. 5, wafer support grooves 56 each for holding a semiconductor wafer W, and ring support grooves 58 each for holding a plate-like ring 5 having a diameter larger than that of the wafer W and made of quartz or the like, are alternately formed on each of the columns 54. By means of the grooves 56 and 58, a plurality of, for example, several tens to a hundred and several tens of wafers W and rings 5, can be held alternately among the four columns 54.

Figure 6:
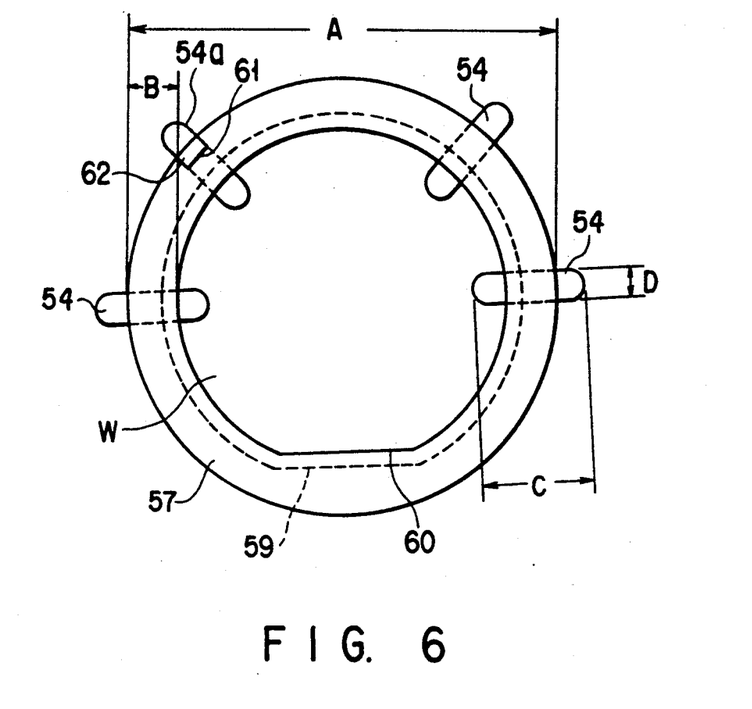
FIG. 6 is a horizontal cross sectional view showing the wafer boat.
Figure 8:
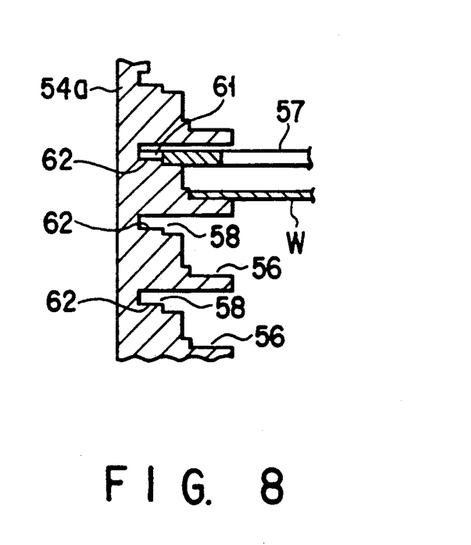
FIG. 8 is a cross sectional view showing another part of the wafer boat.

As can be seen in FIG. 6, an orientation flat portion 60 is formed on each ring 57 at the position corresponding to the orientation flat 59 of a wafer W. Further, a notch 61 is formed in the periphery of each ring 57 for the purpose of positioning. As shown in FIG. 8, a step portion 62 used for positioning is formed in each ring support groove 58 of a column 54a at the position corresponding to that of the notch 61.

The size of a ring 57 should be appropriately determined in accordance with the film formation conditions. For example, an outer diameter should be 10-20 mm larger than the diameter of the wafer, and a width B should be 5-20 mm. The thickness of the ring 57 can be made less than three times that of the wafer, since the ring does not require a mechanical strength enough to support the wafer. Specifically, since the thickness of the wafer is generally 0.6 mm-0.7 mm, the ring can be made as thin as about 2 mm or less.

In this embodiment, for wafers each having an diameter of 6 inches, and a thickness of 0.6-0.7 mm, the outer diameter A, width B, and thickness of the ring are set to 170 mm, 10 mm (the inner diameter of 150 mm), and about 1.5 mm.

The columns 54 and 54a support not only wafers W, but also rings 57 each having a diameter, for example, 10-20 mm larger than each wafer, and therefore if the shape of each column were cylindrical as in the conventional wafer boat, the diameter thereof would be so large that a gas flow is disturbed, thereby deteriorating the uniformity of process within the surface of a wafer W. Further, the weight of each column becomes so large that it is difficult to handle. In order to avoid the above drawback, a quartz rod having a rectangular cross section or a shape close to a rectangle should be used. In this embodiment, there is used a quartz rod having a cross section, the length C of which is 22 mm, and width D is 12 mm, such as shown in FIG. 6. When silicon carbide (SiC) is used as the material of this column, the width of the column can be further reduced.

Figure 7:
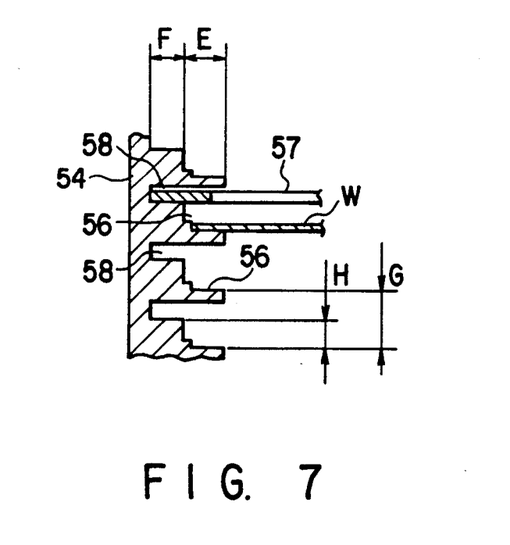
FIG. 7 is a fragmentary sectional view showing the wafer boat.

The shape of each of the wafer support grooves 56 and the ring support grooves 58 formed in each of the columns 54 and 54a is relatively simple, and these grooves can be made by means of a mechanical process. For this reason, the grooves 56 and 58 can be formed at a high dimensional precision, and there is no need to provide a larger than enough interval between adjacent wafer placement positions (an interval between adjacent grooves 56), so as to compensate for its poor dimensional precision as in the conventional technique. In the embodiment, regular intervals G between grooves 56 (intervals between wafer placement positions) shown in FIG. 7 are set at 6/16 inches (9.525 mm), which are ⅔ of the intervals between wafer placement positions of the conventional wafer boat of the type using rings, i.e. 9/16 inches. In other words, the number of wafers which can be placed in the boat having a certain length is 1.5 times as many as those on the conventional boat of this type.

In the embodiment, each ring support groove 58 is located at substantially the mid-point between two wafer support grooves 56 adjacent to each other. However, the distance between the grooves 56 and 58 can be changed in accordance with process conditions. The width E of the wafer mounting surface in each wafer support groove 56, and the width F of the ring mounting surface of each ring support groove 58 should be at least several millimeters. The dimension of each of the other sections can be changed in accordance with the size of a wafer W, the size of a ring 57, the strength of each of the columns 54 and 54a, and the like.

The wafer boat 17, before use, is assembled setting the ring 57 into each groove 58 of the columns 54 and 54a. After each ring 57 is set into each groove 58, the ring is fixed to the columns 54 and 54a by spot welding, if necessary. In the case where each ring 57 is not fixed to the columns 54 and 54a, each ring 57 may accidentally fall out of each groove during an operation; however since each ring 57 can be removed from the boat 17 before washing the boat, the boat can be better cleaned.

The operation of the apparatus of the embodiment will now be described.

Before a film formation process is carried out on a semiconductor wafer by means of the CVD apparatus 1, wafers are placed in the wafer boat 17 in the unloading room 9. At this stage, the boat 17 is supported by the heat preservation cylinder 30 placed on the second arm 21 of the elevator 14 as in the manner shown in FIG. 2. The five arms 25 of the convey robot 15 are driven so as to remove five wafers from a cassette 16a in the cassette portion 16, and the five wafers are set on the boat 17. In this embodiment, the wafers in each of cassettes 16a-16h are arranged at regular intervals of 3/16 inches, whereas those in the boat 17 are arranged at regular intervals of 6/16 inches. Therefore, while the wafers are transferred from the cassette 16a to the boat 17, the interval changing mechanism of the drive block 24 is driven to double the intervals between arms 25. Then, the wafers are set on the boat 17 by the arms 25. How the arms 25, wafers W, and rings 57 are positioned in relation to each other is shown in FIG. 5 by a sectional view.

After completion of setting of a predetermined number of wafers in the boat 17, the elevator 14 is driven so as to load the heat preserving cylinder 30 and the boat 17 in the process chamber 11. Then, the electrical power applied to the coil in each zone of a 3-zone heater 12 is controlled appropriately to set an appropriate temperature of the process chamber 11. For example, in the case where an oxidation film is formed by a CVD method, the temperature of the center portion and lower end portion of a wafer-set section in the process chamber 11 is set to be 800° C., and that of the upper portion is set to be 810° C. Then, 1200 SCCM of nitrous oxide ($N_2O$) and 30 SCCM of monosilane ($SiH_4$) are allowed to flow into the process chamber 11 from a gas introduction tube 37. At the same time, an exhaustion pump P and a conductance bulb (not shown) are operated to adjust pressure in the process chamber 11 to 0.7 Torr.

After completion of the process in the process chamber 11, the elevator 14 is driven so as to unlead the heat preservation cylinder 30 and the boat 17 from the process chamber 11, and the wafers are transferred from the boat 17 to the cassette 16a by use of the arms 25.

EXPERIMENT 1

With a wafer boat 17 according to the present invention, an oxidation film was formed on each of semiconductor wafers by use of the CVD apparatus shown in FIG. 1. Then, the relationship between a thickness distribution within the surface of a wafer and various widths B of different rings 57 was looked into. In this examination, the diameter of wafers, and the outer diameter of the rings 57 were fixed to 6 inches and 170 mm, respectively, but four types of ring 57 having various widths B of 3 mm, 5 mm, 15 mm, and 21.5 mm were used. The temperature in the process chamber 11 was set to be about 800° C.–810° C., and the pressure in the process chamber 11 was set to 0.7 Torr. There were used 1200 SCCM of nitrous oxide gas ($N_2O$) and 30 SCCM of monosilane gas ($SiH_4$).

Figure 9:
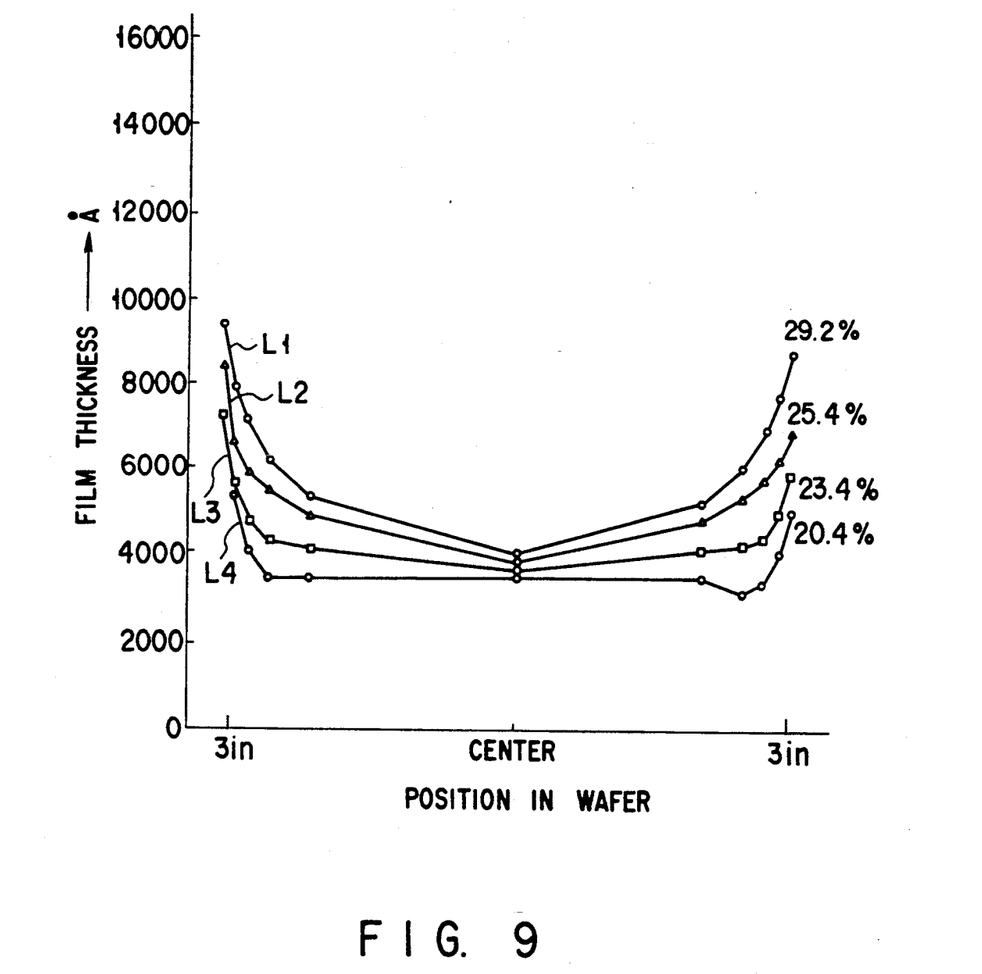
FIG. 9 is a graph showing a relationship between a width of a ring and a thickness distribution of a film formed on a wafer.

The results of the examination were as shown in the graph of FIG. 9. In this graph, the vertical axis indicates a film thickness, and the horizontal axis indicates a position within the surface of a wafer. Curves L1, L2, L3, and L4 in the graph indicate the cases where the widths B of the ring 57 are 3 mm, 5 mm, 15 mm, and 21.5 mm, respectively.

As can be understood from this graph, the thickness distribution within the surface of a wafer is gradually uniformed as the width B of the ring 57 increases. However, once the width B becomes too large, the amount of gas which reaches the periphery of a wafer decreases. Regarding the curve L4, the thickness decreases for a while near the periphery of the wafer, and this is due to a decrease in amount of gas which reaches the periphery of the wafer. Thus, the width of the ring 57 should preferably be about 10 to 30 mm.

EXPERIMENT 2

Under the same conditions as those of Experiment 1, formation of films was carried out while changing the surface state of a quartz ring 57. In this experiment, it was found that the uniformity of thickness within the surface of a wafer was improved by smoothing the surface of the quartz ring 57. In the case where the surface of the ring 57 was left coarse as frosted glass, the uniformity of thickness within the surface of a wafer was deteriorated even the process was carried out under the same conditions, or the reproducibility of the process was low. Therefore, the surface of the ring 57 should preferably be mirror-polished at 10 $\mu$m or less, or heated to smooth the fine irregular configuration thereof, i.e. so-called roasted.

According to the present invention, the uniformity of heat within the surface of a wafer is improved by a ring 57, and a process gas can be efficiently supplied to wafers, enhancing the uniformity of thickness within the surface of a wafer.

Further, each wafer W and each ring 57 are respectively supported by each wafer support groove 56 and each ring support groove 58 provided stepwise in the columns 54 and 54a. Thus, the shape of each structural member does not become complicated, and therefore each member can be easily prepared.

The present invention is applicable for a CVD process for making, for example, phosphor-doped polysilicon film, and boron-doped glass film. The invention is also applicable for other heat treatments including formation of a thermal oxidation film, diffusion process, and etching process.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A vertical boat used for heat-treating a plurality of semiconductor wafers each having a main region to be processed on the upper surface, at the same time, comprising:
    an upper support plate;
    a lower support plate;
    a plurality of columns, an upper end of each of which is fixed to the upper support plate, and a lower end of each of which is fixed to the lower support plate, each of said columns having a plurality of first steps formed in the vertical direction with intervals therebetween so as to support the wafers substantially parallel to each other, and a plurality of second steps formed so as to be arranged alternately with the first steps; and
    a plurality of plate rings, each having an outer diameter larger than that of the wafers, and an inner diameter defining an opening for exposing substantially the entire main region of each wafer, and provided on the second steps, said rings serving to improve a uniformity of a heat treatment carried out on each wafer;
    wherein each first step is arranged such that one of the wafers supported thereon is positioned apart from lower and upper rings of the plate rings adjacent to said one of the wafers with first and second clearances formed therebetween, respectively, in the vertical direction so as not to contact the lower and upper rings, the first clearance having a dimension to allow transfer means for transferring said one of the wafers to be inserted therein and the second clearance having a dimension to allow the transfer means to lift said one of the wafers.

2. The boat according to claim 1, wherein the first steps are arranged at regular intervals.

3. The boat according to claim 2, wherein the second steps are arranged at regular intervals.

4. The boat according to claim 3, wherein the ring has a thickness of less than tree times as much as that of the wafer.

5. The boat according to claim 4, wherein each of the column has a horizontal cross section of an elliptic shape, which has a longitudinal axis extending in a radial direction of the ring.

6. The boat according to claim 4, wherein a notch for positioning is formed in a periphery section of the ring, and a positioning step which is engaged with the notch is formed in each of the second steps of one of the columns.

7. The boat according to claim 4, wherein the width of the ring is 10–30 mm.

8. The boat according to claim 4, wherein the columns and the rings are made of quartz.

9. The apparatus according to claim 4, wherein each of the column has a horizontal cross section of an elliptic shape, which has a longitudinal axis extending in a radial direction of the ring.

10. The apparatus according to claim 4, wherein a notch for positioning is formed in a periphery section of the ring, and a positioning step which is engaged with the notch is formed in each of the second steps of one of the columns.

11. The boat according to claim 1, wherein the second steps comprise grooves formed in the columns.

12. A vertical heat treatment apparatus used for heat-treating a plurality of semiconductor wafers each having a main region to be processed on the upper surface, at the same time, comprising;
 a) a process chamber;
 b) a heater for heating the process chamber;
 c) gas supply means for supplying process gas in the process chamber;
 d) exhaustion means for exhausting the process chamber; and
 e) a vertical boat for supporting the wafers in the process chamber, and comprising:
  an upper support plate;
  a lower support plate;
  a plurality of columns, an upper end of each of which is fixed to the upper support plate, and a lower end of each of which is fixed to the lower support plate, each of said columns having a plurality of first steps formed in the vertical direction with intervals therebetween so as to support the wafers substantially parallel to each other, and a plurality of second steps formed so as to be arranged alternately with the first steps; and
  a plurality of plate rings, each having an outer diameter larger than that of the wafers, and an inner diameter defining an opening for exposing substantially the entire main region of each wafer, and provided on the second steps, said rings serving to improve a uniformity of a heat treatment carried out on each wafer;
  wherein each first step is arranged such that one of the wafers supported thereon is positioned apart from lower and upper rings of the plate rings adjacent to said one of the wafers with first and second clearances formed therebetween, respectively, in the vertical direction so as not to contact the lower and upper rings, the first clearance having a dimension to allow transfer means for transferring said one of the wafers to be inserted therein and the second clearance having a dimension to allow the transfer means to lift said one of the wafers.

13. The apparatus according to claim 12, wherein the first steps are arranged at regular intervals, and the second steps are arranged at regular intervals.

14. The apparatus according to claim 13, wherein the ring has a thickness of less than three times as much as that of the wafer.

15. The apparatus according to claim 12, wherein the second steps comprise grooves formed in the columns.

16. The apparatus according to claim 14, wherein the gas supply means further includes means for supplying a gas for forming a film on the wafers by a CVD method.

17. A CVD apparatus used for treating a plurality of semiconductor wafers each having a main region to be processed on the upper surface, at the same time, comprising:
 a) a process chamber;
 b) a heater for heating the process chamber;
 c) gas supply means for supplying process gas in the process chamber;
 d) exhaustion means for exhausting the process chamber;
 e) a vertical boat for supporting the wafers in the process chamber, and comprising:
  an upper support plate;
  a lower support plate;
  a plurality of columns, an upper end of each of which is fixed to the upper support plate, and a lower end of each of which is fixed to the lower support plate, each of said columns having a plurality of first steps formed in the vertical direction at regular intervals therebetween so as to support the wafers substantially parallel to each other, and a plurality of second steps formed at regular intervals so as to be arranged alternately with the first steps; and
  a plurality of plate rings, each having an outer diameter larger than that of the wafers, and an inner diameter defining an opening for exposing substantially the entire main region of each wafer, and provided on the second steps, said rings serving to improve a uniformity of thickness of a film to be formed on each wafer;
  wherein each first step is arranged such that one of the wafers supported thereon is positioned apart from lower and upper rings of the plate rings adjacent to said one of the wafers with first and second clearances formed therebetween, respectively, in the vertical direction so as not to contact the lower and upper rings, the first clearance having a dimension to allow transfer mans for transferring said one of the wafers to be inserted therein and the second clearance having a dimension to allow the transfer means to lift said one of the wafers;
 f) an elevator located below the process chamber, said elevator lifting/lowering the boat in which the wafers are set between a first position where the boat is loaded in the process chamber, and a second position where the boat is unloaded from the process chamber;
 g) transfer means for transferring the wafers to/from the boat located outside the process chamber; and
 h) a wafer cassette, to/from which the wafers are transferred from/to the boat by the transfer means 18. The apparatus apparatus according to claim 17, wherein the transfer means includes a plurality of arms for transferring the plurality of wafers all at once to/from the boat.

19. The apparatus according to claim 18, wherein the transfer means further includes means for changing an interval of the arms when the wafers are transferred between the wafer cassette and the boat.

20. The apparatus according to claim 19, wherein the ring has a thickness of less than three times as much as that of the wafer.

21. The apparatus according to claim 20, wherein each of the column has a horizontal cross section of an elliptic shape, which has a longitudinal axis extending in a radial direction of the ring.

22. The apparatus according to claim 20, wherein a notch for positioning is formed in a periphery section of the ring, and a positioning step which is engaged with the notch is formed in each of the second steps of one of the columns.

23. The apparatus according to claim 17, wherein the second steps comprise grooves formed in the columns.

24. The apparatus according to claim 17, further comprising moving means provided on the elevator, for moving the boat from the second position to a third position, where the wafers are transferred to/from the boat.

* * * * *

UNITED STATES PATENT AND TRADEMARK OFFICE
CERTIFICATE OF CORRECTION

PATENT NO. : 5,316,472
DATED : May 31, 1994
INVENTOR(S) : Reiji NIINO, et al.

It is certified that error appears in the above-indentified patent and that said Letters Patent is hereby corrected as shown below:

On the title page, Item [75], the inventorship should read as follows:

--Reiji Niino, Kofu; Isao Shiratani; Yutaka Shimada, both of Sagamihara; Hiroki Fukushima, Sagamihara; Hirofumi Kitayama, Kanagawa; Akimichi Yonekura; Yuuichi Mikata, both of Kawasaki, all of Japan--

Signed and Sealed this

Eighth Day of November, 1994

Attest:

BRUCE LEHMAN

*Attesting Officer*  *Commissioner of Patents and Trademarks*